US011639115B2

(12) United States Patent
Yoon

(10) Patent No.: US 11,639,115 B2
(45) Date of Patent: May 2, 2023

(54) POWER RELAY ASSEMBLY DETERIORATION CONTROL SYSTEM FOR VEHICLES AND POWER RELAY ASSEMBLY DETERIORATION CONTROL METHOD THEREOF

(71) Applicants: Hyundai Motor Company, Seoul (KR); KIA Motors Corporation, Seoul (KR)

(72) Inventor: Jong Seo Yoon, Icheon (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 392 days.

(21) Appl. No.: 16/851,207

(22) Filed: Apr. 17, 2020

(65) Prior Publication Data

US 2021/0178923 A1 Jun. 17, 2021

(30) Foreign Application Priority Data

Dec. 16, 2019 (KR) .......................... 10-2019-0167877

(51) Int. Cl.
*B60L 53/62* (2019.01)
*G01R 31/392* (2019.01)
*G01R 31/367* (2019.01)

(52) U.S. Cl.
CPC ............ *B60L 53/62* (2019.02); *G01R 31/367* (2019.01); *G01R 31/392* (2019.01)

(58) Field of Classification Search
CPC ........ B60L 53/62; B60L 58/10; B60L 3/0023; B60L 3/12; B60L 3/0046; B60L 3/0084;
(Continued)

(56) References Cited

U.S. PATENT DOCUMENTS 8,655,535 B2 * 2/2014 Oh ...................... B60L 15/2045
701/22
10,605,837 B2 * 3/2020 Nakashima ........ G01R 31/3278
(Continued)

FOREIGN PATENT DOCUMENTS

CN 105717457 B 11/2018
CN 109001631 A 12/2018
(Continued)

*Primary Examiner* — Stacy Whitmore
(74) *Attorney, Agent, or Firm* — McDonnell Boehnen Hulbert & Berghoff LLP

(57) ABSTRACT

Disclosed are a power relay assembly (PRA) deterioration control system for vehicles capable of predicting breakdown of the PRA and actively controlling deterioration of the PRA using big data and a PRA deterioration control method thereof. The PRA deterioration control system includes a vehicle configured to transmit PRA and battery information and a server configured to collect the PRA and battery information of the vehicle and to transmit output control information for PRA deterioration control to the vehicle, wherein, upon collecting the PRA and battery information of the vehicle, the server groups the collected information, sets a monitoring step by vehicle based on the grouped information, performs monitoring by vehicle in response to the set monitoring step by vehicle, and transmits output control information by vehicle corresponding to the result of monitoring to the vehicle such that each vehicle performs PRA deterioration control.

19 Claims, 13 Drawing Sheets

(58) Field of Classification Search
CPC .... B60L 53/305; B60L 53/65; B60L 2240/54; B60L 2250/10; G01R 31/367; G01R 31/392; Y02T 10/70; Y02T 10/7072; Y02T 90/12; Y02T 90/16; B60Y 2200/91; B60Y 2200/92
See application file for complete search history.

(56) References Cited

U.S. PATENT DOCUMENTS

| | | | |
|---|---|---|---|
| 10,753,975 B2* | 8/2020 | Park | H01M 10/425 |
| 10,807,474 B2* | 10/2020 | Song | B60L 58/21 |
| 11,155,172 B2* | 10/2021 | Chang | B60L 50/66 |
| 11,257,644 B2* | 2/2022 | Masuda | H02J 7/0031 |
| 11,296,519 B2* | 4/2022 | Chen | G01R 19/16542 |
| 2009/0027817 A1* | 1/2009 | Kamiyama | H02H 1/06 |
| | | | 361/71 |
| 2013/0116875 A1* | 5/2013 | Oh | B60L 53/14 |
| | | | 701/22 |
| 2016/0156516 A1* | 6/2016 | Nishi | H04L 43/16 |
| | | | 370/329 |
| 2019/0199108 A1* | 6/2019 | Hiroe | H02J 7/0047 |
| 2019/0229541 A1* | 7/2019 | Ono | H02J 7/0024 |
| 2020/0408483 A1* | 12/2020 | Cao | A62C 3/025 |
| 2021/0339651 A1* | 11/2021 | Mukae | B60L 58/12 |

FOREIGN PATENT DOCUMENTS

| | | | | |
|---|---|---|---|---|
| CN | 106168799 B | 5/2019 | | |
| KR | 101946163 B | 4/2019 | | |
| WO | WO-2004082122 A1 * | 9/2004 | | B60K 6/445 |

* cited by examiner

POWER RELAY ASSEMBLY DETERIORATION CONTROL SYSTEM FOR VEHICLES AND POWER RELAY ASSEMBLY DETERIORATION CONTROL METHOD THEREOF

CROSS-REFERENCE TO RELATED APPLICATIONS

This application claims the benefit of Korean Patent Application No. 10-2019-0167877, filed on Dec. 16, 2019, which is hereby incorporated by reference as if fully set forth herein.

BACKGROUND

Field of the Invention

The present invention relates to a power relay assembly (PRA) deterioration control system for vehicles, and more particularly to a PRA deterioration control system for vehicles capable of predicting breakdown of the PRA and actively controlling deterioration of the PRA using big data and a PRA deterioration control method thereof.

Discussion of the Related Art

In general, a hybrid electric vehicle (HEV), an electric vehicle (EV), a fuel cell vehicle (FCV), etc. have been developed and used as a plan for improving the global environment. In particular, it is expected that development of the electric vehicle will become further prominent in the future.

Such an electric vehicle or hybrid electric vehicle includes a high-voltage battery and a high-voltage circuit unit configured to supply electric power to a motor, which is a driving source.

The high-voltage circuit unit may include a motor configured to be driven by the electric power from the high-voltage battery, a motor control unit (MCU) including an inverter configured to drive the motor, and a power relay assembly (PRA) configured to perform switching such that the electric power from the battery is selectively supplied to the vehicle.

Here, a deteriorated state of the PRA may vary depending on deviation between parts of the vehicle, the assembled state of the vehicle, or the amount of high-voltage battery energy that is used. In the case in which the deteriorated state of the PRA is not controlled, the PRA may catch fire due to overcurrent.

At present, however, it is impossible to accurately measure the deteriorated state of the PRA. In addition, since technology capable of actively control heating of the PRA has not been developed, deterioration of the PRA may be accelerated, and the PRA may catch fire due to overcurrent.

Therefore, there is a need to develop a PRA deterioration control system for vehicles capable of periodically monitoring the deteriorated state of the PRA, thereby predicting deterioration of the PRA and actively controlling deterioration of the PRA.

SUMMARY

Accordingly, the present invention is directed to a power relay assembly (PRA) deterioration control system for vehicles and a PRA deterioration control method thereof that substantially obviate one or more problems due to limitations and disadvantages of the related art.

An object of the present invention is to provide a PRA deterioration control system for vehicles capable of collecting PRA and battery information of a vehicle, grouping the collected information, setting a monitoring step by vehicle based on the grouped information, and periodically monitoring a deteriorated state of the PRA based on the monitoring step by vehicle, whereby it is possible to predict deterioration of the PRA and to actively control deterioration of the PRA, and a PRA deterioration control method thereof.

Objects of the present invention devised to solve the problems are not limited to the aforementioned object, and other unmentioned objects will be clearly understood by those skilled in the art based on the following detailed description of the present invention.

To achieve these objects and other advantages and in accordance with the purpose of the invention, as embodied and broadly described herein, a PRA deterioration control system for vehicles includes a vehicle configured to transmit PRA and battery information and a server configured to collect the PRA and battery information of the vehicle and to transmit output control information for PRA deterioration control to the vehicle, wherein, upon collecting the PRA and battery information of the vehicle, the server groups the collected information, sets a monitoring step by vehicle based on the grouped information, performs monitoring by vehicle in response to the set monitoring step by vehicle, and transmits output control information by vehicle corresponding to the result of monitoring to the vehicle such that each vehicle performs PRA deterioration control.

In another aspect of the present invention, a PRA deterioration control method of a PRA deterioration control system for vehicles, including a server, includes the server collecting PRA and battery information from a vehicle, the server grouping the collected information, the server setting a monitoring step by vehicle based on the grouped information, the server performing monitoring by vehicle in response to the set monitoring step by vehicle, the server transmitting output control information by vehicle corresponding to the result of monitoring to the vehicle, and the vehicle performing PRA deterioration control based on the output control information.

In another aspect of the present invention, a computer-readable recording medium containing a program for performing the PRA deterioration control method of the PRA deterioration control system for vehicles executes processes included in the PRA deterioration control method of the PRA deterioration control system for vehicles.

In another aspect of the present invention, a vehicle of a PRA deterioration control system for vehicles includes a communication unit communicatively connected to a server and a battery controller configured to control a battery output based on output control information received from the server, wherein the battery controller monitors a PRA and a battery to acquire PRA and battery information, controls the communication unit to transmit the acquired PRA and battery information to the server, and, upon receiving output control information from the server, monitors a PRA temperature based on the output control information to control the battery output.

In a further aspect of the present invention, a server of a PRA deterioration control system for vehicles includes a communication unit communicatively connected to a vehicle, a data grouping unit configured to collect PRA and battery information of the vehicle and to group the collected information, and an active output controller configured to set a monitoring step by vehicle based on the grouped information, to perform monitoring by vehicle in response to the set monitoring step by vehicle, and to transmit output control information by vehicle corresponding to the result of monitoring to the vehicle.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
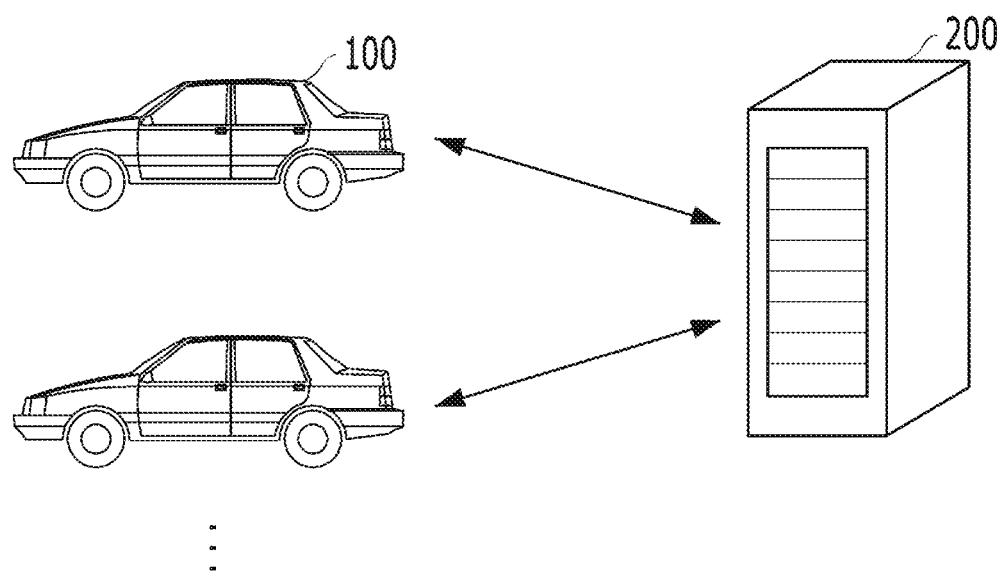
FIG. 1 is a view illustrating a power relay assembly (PRA) deterioration control system for vehicles according to an embodiment of the present invention.

Reference will now be made in detail to the preferred embodiments of the present invention, examples of which are illustrated in the accompanying drawings. The following embodiments are given by way of example in order to enable those skilled in the art to fully understand the idea of the present invention. Therefore, the present invention is not limited by the following embodiments, and may be realized in various other forms. In order to clearly describe the present invention, parts having no relation with the description of the present invention have been omitted from the drawings. Wherever possible, the same reference numerals will be used throughout the specification to refer to the same or like parts.

The term "comprises" or "includes" used herein should be interpreted not to exclude other elements but to further include such other elements, unless mentioned otherwise. In addition, the term "unit" or "module" used herein signifies one unit that processes at least one function or operation, and may be realized by hardware, software, or a combination thereof.

In addition, the same reference numerals denote the same constituent elements throughout the specification.

Hereinafter, a PRA deterioration control system for vehicles and a PRA deterioration control method thereof, which may be applied to embodiments of the present invention, will be described in detail with reference to FIGS. 1 to 13.

FIG. 1 is a view illustrating a power relay assembly (PRA) deterioration control system for vehicles according to an embodiment of the present invention.

As shown in FIG. 1, the PRA deterioration control system for vehicles according to the present invention may include a vehicle 100 configured to transmit PRA and battery information and a server 200 configured to collect the PRA and battery information of the vehicle 100 and to transmit output control information for PRA deterioration control to the vehicle 100.

Here, the vehicle 100 may monitor the PRA and the battery to acquire PRA and battery information, and may transmit the acquired PRA and battery information to the server 200.

At this time, the vehicle 100 may acquire the PRA and battery information through CAN communication, and may transmit the acquired PRA and battery information to the server 200 through wireless communication.

When transmitting the acquired PRA and battery information, the vehicle 100 may transmit information including at least one of vehicle identification (ID), the accumulated amount of charge and discharge energy of the battery, a rate by section of each current that is used, an actual output of battery, or a PRA temperature to the server 200.

Subsequently, upon receiving the output control information for PRA deterioration control from the server 200, the vehicle 100 may monitor the PRA temperature based on the output control information in order to control the battery output.

Here, when receiving the output control information, the vehicle 100 may receive at least one of the vehicle identification (ID), monitoring step information by vehicle, or an active output limit value of the battery from the server 200.

The vehicle 100 may change a period for communication with the server 200 according to the monitoring step.

Here, the vehicle 100 may set the period for communication with the server 200 to one time at the point in time when collection of the PRA information is finished during traveling and charging in the case in which the monitoring step is a normal step or a caution step, and may set the period for communication with the server 200 to 1 second during traveling and charging in the case in which the monitoring step is a warning step.

At this time, the vehicle 100 may recognize that the PRA temperature exhibits no abnormal sign in the case in which the monitoring step is a normal step, may recognize that the PRA temperature exhibits an abnormal sign in the case in which the monitoring step is a caution step, and may recognize that the PRA temperature reaches a critical value in the case in which the monitoring step is a warning step.

Next, when performing the PRA deterioration control, the vehicle 100 may primarily limit the battery output in the case in which the PRA temperature reaches a predetermined percentage of a critical temperature, may secondarily limit the battery output in the case in which the PRA temperature continuously increases for a predetermined time, and may turn off a main relay of the PRA in the case in which the PRA temperature exceeds the critical temperature.

As an example, the predetermined percentage of the critical temperature may be about 70% of the critical temperature, and the predetermined time may be about 10 seconds.

When primarily limiting the battery output, the vehicle 100 may limit the battery output by the actual output of the vehicle 100, and, when secondarily limiting the battery output, the vehicle 100 may further limit the battery output by an increment of the PRA temperature.

Also, in the case in which the PRA temperature does not exceed the critical temperature, the vehicle 100 may further limit the battery output by an increment of the PRA temperature.

Also, in the case in which the PRA temperature does not reach the predetermined percentage of the critical temperature or in the case in which the PRA temperature does not continuously increase for the predetermined time, the vehicle 100 may limit the battery output by the actual output of the vehicle 100.

In addition, when primarily or secondarily limiting the battery output, the vehicle 100 may transmit a preventive maintenance guidance flag to a cluster.

Next, upon collecting the PRA and battery information of the vehicle 100, the server 200 may group the collected information, may set a monitoring step by vehicle based on the grouped information, may perform monitoring by vehicle in response to the set monitoring step by vehicle, and may transmit output control information by vehicle corresponding to the result of monitoring to the vehicle 100 such that each vehicle performs PRA deterioration control.

When grouping the collected information, the server 200 may group the collected information by traveling pattern to classify a plurality of groups by traveling pattern, and may regroup information in the groups by traveling pattern by amount of energy that is used to classify a plurality of subgroups by use of energy.

Here, when classifying the groups by traveling pattern, the server 200 may store a profile by battery charge and discharge current section, may calculate a current occupation rate by battery charge and discharge current section, may calculate a correlation coefficient by vehicle based on the current occupation rate, may classify vehicles as the same group in the case in which the correlation coefficient is greater than a predetermined rate, may classify vehicles as an unassigned group in the case in which the correlation coefficient is equal to or less than the predetermined rate, may calculate an average current occupation rate by group, may calculate a correlation coefficient between the vehicles classified as the unassigned group and the average current occupation rate by group, may reclassify the vehicles classified as the unassigned group in the case in which the correlation coefficient is greater than a predetermined rate, and may maintain the vehicles classified as the unassigned group in the case in which the correlation coefficient is equal to or less than the predetermined rate.

As an example, the server 200 may classify vehicles as the same group in the case in which the correlation coefficient is greater than about 70%, may classify vehicles as an unassigned group in the case in which the correlation coefficient is equal to or less than about 70%, may reclassify the vehicles classified as the unassigned group in the case in which the correlation coefficient is greater than about 70%, and may maintain the vehicles classified as the unassigned group in the case in which the correlation coefficient is equal to or less than about 70%.

In addition, when classifying the subgroups by use of energy, the server 200 may calculate vehicles in the groups by traveling pattern using a plurality of histogram sections depending on the total amount of energy that is used, and may perform subgrouping by histogram section to classify the subgroups by use of energy.

Next, when setting the monitoring step by vehicle, the server 200 may monitor the PRA temperature and the actual output of battery by vehicle of each subgroup, and may set the monitoring step by vehicle based on the result of monitoring.

When performing the monitoring by vehicle, the server 200 may monitor the vehicle in the caution step of the monitoring step in the case in which the maximum PRA temperature and a PRA temperature increase rate per output are within a predetermined upper rate in the grouped information and occur successively for several cycles, and may monitor the vehicle in the normal step of the monitoring step in the case in which the maximum PRA temperature and the PRA temperature increase rate per output are not within the predetermined upper rate in the grouped information.

As an example, in the case in which the maximum PRA temperature and the PRA temperature increase rate per output are within upper 5% in the grouped information and occur successively for two cycles, the server 200 may monitor the vehicle in the caution step of the monitoring step.

Also, in the case in which the monitoring step is a normal step, the server 200 may recognize that the PRA temperature of the vehicle exhibits no abnormal sign and may monitor the PRA temperature in the normal step, and, in the case in which the monitoring step is a caution step, the server 200 may recognize that the PRA temperature of the vehicle exhibits an abnormal sign and may monitor the PRA temperature in the caution step.

As an example, the server 200 may determine whether the monitoring step is a normal step or a caution step only once at the point in time when collection of the PRA information is finished during traveling and charging.

Next, when performing the monitoring by vehicle, the server 200 may monitor the vehicle 100 in the warning step of the monitoring step in the case in which the PRA temperature of the vehicle reaches the predetermined percentage of the critical temperature.

As an example, the predetermined percentage of the critical temperature may be about 70% of the critical temperature.

In the case in which the PRA temperature of the vehicle does not reach the predetermined percentage of the critical temperature, the server 200 may monitor the vehicle in the normal step of the monitoring step.

As an example, the server 200 may determine whether the monitoring step is a warning step at an interval of about 1 second during traveling and charging.

Next, when transmitting the output control information by vehicle, the server 200 may transmit the output control information including the vehicle identification (ID), the monitoring step information by vehicle, and the active output limit value of the battery to the vehicle in the case in which the monitoring step is a warning step.

Subsequently, when transmitting the output control information by vehicle, the server 200 may store the PRA temperature pattern of abnormal behavior vehicles by group.

In addition, when transmitting the output control information by vehicle, the server 200 may transmit a preventive maintenance guidance flag to the vehicle 100 for cluster alarm of the vehicle.

In the present invention, as described above, it is possible to collect the PRA and battery information of the vehicle, to group the collected information, to set the monitoring step by vehicle based on the grouped information, and to periodically monitor the deteriorated state of the PRA based on the monitoring step by vehicle, whereby it is possible to predict deterioration of the PRA and to actively control deterioration of the PRA.

Also, in the present invention, it is possible to construct logic only by changing software without additional hardware.

Also, in the present invention, it is possible to determine the extent of deterioration or breakdown of the PRA through comparison in PRA temperature between vehicles.

Also, in the present invention, it is possible to preemptively limit power, whereby it is possible to prevent acceleration of generation of heat in the battery or deterioration of the PRA.

Figure 2:
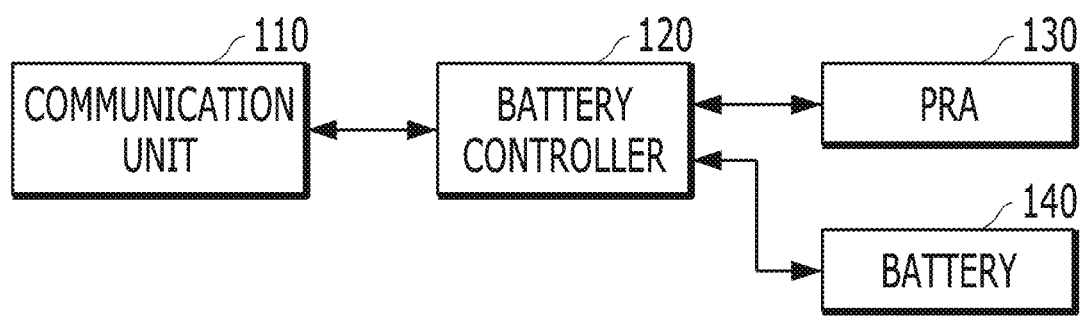
FIG. 2 is a block diagram illustrating a vehicle of a PRA deterioration control system for vehicles according to an embodiment of the present invention.

FIG. 2 is a block diagram illustrating a vehicle of a PRA deterioration control system for vehicles according to an embodiment of the present invention.

As shown in FIG. 2, the vehicle 100 according to the present invention may include a communication unit 110 communicatively connected to the server 200 and a battery controller 120 configured to control the battery output based on output control information received from the server 200.

As an example, the communication unit 110 may be an audio-video-navigation (AVN) of the vehicle 100, and the battery controller 120 may be a battery management system; however, the present invention is not limited thereto.

In addition, the battery controller 120 may monitor a PRA 130 and a battery 140 to acquire PRA and battery information, may control the communication unit 110 to transmit the acquired PRA and battery information to the server, and, upon receiving output control information from the server, may monitor the PRA temperature based on the output control information to control the battery output.

Here, the battery controller 120 may acquire the PRA and battery information through CAN communication, and may transmit the acquired PRA and battery information to the server through wireless communication.

When transmitting the acquired PRA and battery information, the battery controller 120 may transmit information including at least one of vehicle identification (ID), the accumulated amount of charge and discharge energy of the battery, a rate by section of each current that is used, an actual output of battery, or a PRA temperature to the server 200.

Subsequently, upon receiving the output control information for PRA deterioration control from the server, the battery controller 120 may monitor the PRA temperature based on the output control information in order to control the battery output.

Here, when receiving the output control information, the battery controller 120 may receive at least one of the vehicle identification (ID), monitoring step information by vehicle, or the active output limit value of the battery from the server.

The battery controller 120 may change a period for communication with the server according to the monitoring step.

Here, the battery controller 120 may set the period for communication with the server to one time at the point in time when collection of the PRA information is finished during traveling and charging in the case in which the monitoring step is a normal step or a caution step, and may set the period for communication with the server to 1 second during traveling and charging in the case in which the monitoring step is a warning step.

Next, when performing the PRA deterioration control, the battery controller 120 may primarily limit the battery output in the case in which the PRA temperature reaches a predetermined percentage of a critical temperature, may secondarily limit the battery output in the case in which the PRA temperature continuously increases for a predetermined time, and may turn off the main relay of the PRA in the case in which the PRA temperature exceeds the critical temperature.

When primarily limiting the battery output, the battery controller 120 may limit the battery output by the actual output of the battery 140, and, when secondarily limiting the battery output, the battery controller 120 may further limit the battery output by an increment of the PRA temperature.

Also, in the case in which the PRA temperature does not exceed the critical temperature, the battery controller 120 may further limit the battery output by an increment of the PRA temperature.

Also, in the case in which the PRA temperature does not reach the predetermined percentage of the critical temperature or in the case in which the PRA temperature does not continuously increase for the predetermined time, the battery controller 120 may limit the battery output by the actual output of the battery 140.

In addition, when primarily or secondarily limiting the battery output, the battery controller 120 may transmit a preventive maintenance guidance flag to the cluster.

Figure 3:
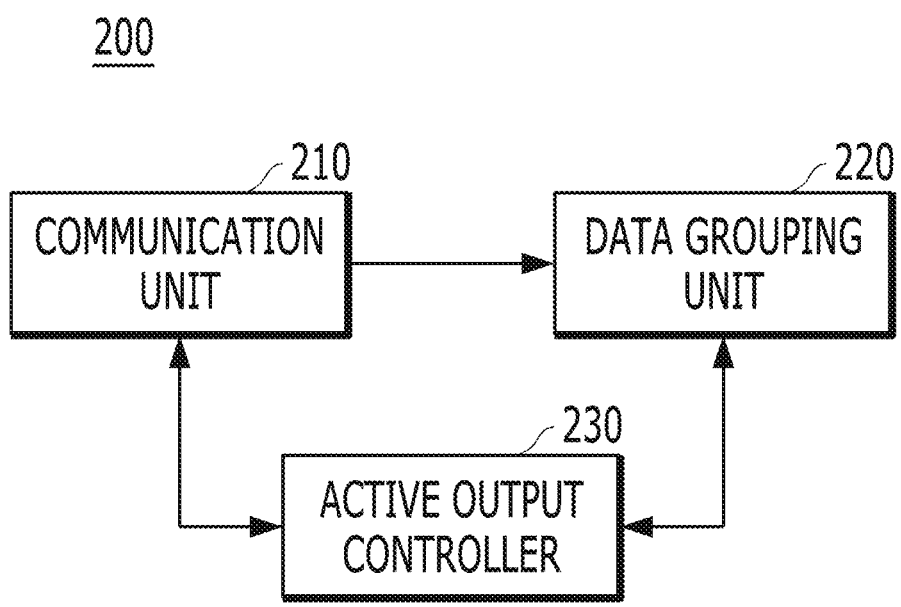
FIG. 3 is a block diagram illustrating a server of a PRA deterioration control system for vehicles according to an embodiment of the present invention.

FIG. 3 is a block diagram illustrating a server of a PRA deterioration control system for vehicles according to an embodiment of the present invention As shown in FIG. 3, the server 200 according to the present invention may include a communication unit 210 communicatively connected to a vehicle, a data grouping unit 220 configured to collect PRA and battery information of the vehicle and to group the collected information, and an active output controller 230 configured to set a monitoring step by vehicle based on the grouped information, to perform monitoring by vehicle in response to the set monitoring step by vehicle, and to transmit output control information by vehicle corresponding to the result of monitoring to the vehicle.

Here, when grouping the collected information, the data grouping unit 220 may group the collected information by traveling pattern to classify a plurality of groups by traveling pattern, and may regroup information in the groups by traveling pattern by amount of energy that is used to classify a plurality of subgroups by use of energy.

That is, when classifying the groups by traveling pattern, the data grouping unit 220 may store a profile by battery charge and discharge current section, may calculate a current occupation rate by battery charge and discharge current section, may calculate a correlation coefficient by vehicle based on the current occupation rate, may classify vehicles as the same group in the case in which the correlation coefficient is greater than a predetermined rate, may classify vehicles as an unassigned group in the case in which the correlation coefficient is equal to or less than the predetermined rate, may calculate an average current occupation rate by group, may calculate a correlation coefficient between the vehicles classified as the unassigned group and the average current occupation rate by group, may reclassify the vehicles classified as the unassigned group in the case in which the correlation coefficient is greater than a predetermined rate, and may maintain the vehicles classified as the unassigned group in the case in which the correlation coefficient is equal to or less than the predetermined rate.

As an example, the data grouping unit 220 may classify vehicles as the same group in the case in which the correlation coefficient is greater than about 70%, may classify vehicles as an unassigned group in the case in which the correlation coefficient is equal to or less than about 70%, may reclassify the vehicles classified as the unassigned group in the case in which the correlation coefficient is greater than about 70%, and may maintain the vehicles classified as the unassigned group in the case in which the correlation coefficient is equal to or less than about 70%.

In addition, when classifying the subgroups by use of energy, the data grouping unit 220 may calculate vehicles in the groups by traveling pattern using a plurality of histogram sections depending on the total amount of energy that is used, and may perform subgrouping by histogram section to classify subgroups by use of energy.

Next, when setting the monitoring step by vehicle, the active output controller 230 may monitor the PRA temperature and the actual output of battery by vehicle of each subgroup, and may set the monitoring step by vehicle based on the result of monitoring.

When performing the monitoring by vehicle, the active output controller 230 may monitor the vehicle in the caution step of the monitoring step in the case in which the maximum PRA temperature and a PRA temperature increase rate per output are within a predetermined upper rate in the grouped information and occur successively for several cycles, and may monitor the vehicle in the normal step of the monitoring step in the case in which the maximum PRA temperature and the PRA temperature increase rate per output are not within the predetermined upper rate in the grouped information.

As an example, in the case in which the maximum PRA temperature and the PRA temperature increase rate per output are within upper 5% in the grouped information and occur successively for two cycles, the active output controller 230 may monitor the vehicle in the caution step of the monitoring step.

Also, in the case in which the monitoring step is a normal step, the active output controller 230 may recognize that the PRA temperature of the vehicle exhibits no abnormal sign and may monitor the PRA temperature in the normal step, and, in the case in which the monitoring step is a caution step, the active output controller 230 may recognize that the PRA temperature of the vehicle exhibits an abnormal sign and may monitor the PRA temperature in the caution step.

As an example, the active output controller 230 may determine whether the monitoring step is a normal step or a caution step only once at the point in time when collection of the PRA information is finished during traveling and charging.

Next, when performing the monitoring by vehicle, the active output controller 230 may monitor the vehicle in the warning step of the monitoring step in the case in which the PRA temperature of the vehicle reaches the predetermined percentage of the critical temperature.

As an example, the predetermined percentage of the critical temperature may be about 70% of the critical temperature.

In the case in which the PRA temperature of the vehicle does not reach the predetermined percentage of the critical temperature, the active output controller 230 may monitor the vehicle in the normal step of the monitoring step.

As an example, the active output controller 230 may determine whether the monitoring step is a warning step at an interval of about 1 second during traveling and charging.

Next, when transmitting the output control information by vehicle, the active output controller 230 may transmit the output control information including at least one of the vehicle identification (ID), the monitoring step information by vehicle, or the active output limit value of the battery to the vehicle in the case in which the monitoring step is a warning step.

Subsequently, when transmitting the output control information by vehicle, the active output controller 230 may store the PRA temperature pattern of abnormal behavior vehicles by group.

In addition, when transmitting the output control information by vehicle, the active output controller 230 may transmit a preventive maintenance guidance flag to the vehicle for cluster alarm of the vehicle.

Figure 4:
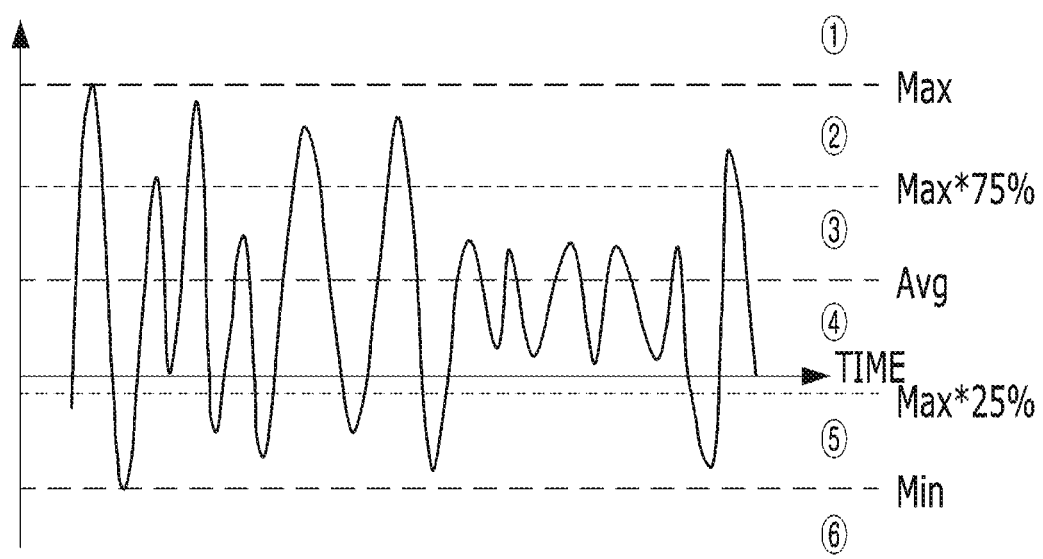
FIG. 4 illustrates a grouping process by traveling pattern.
Figure 5:
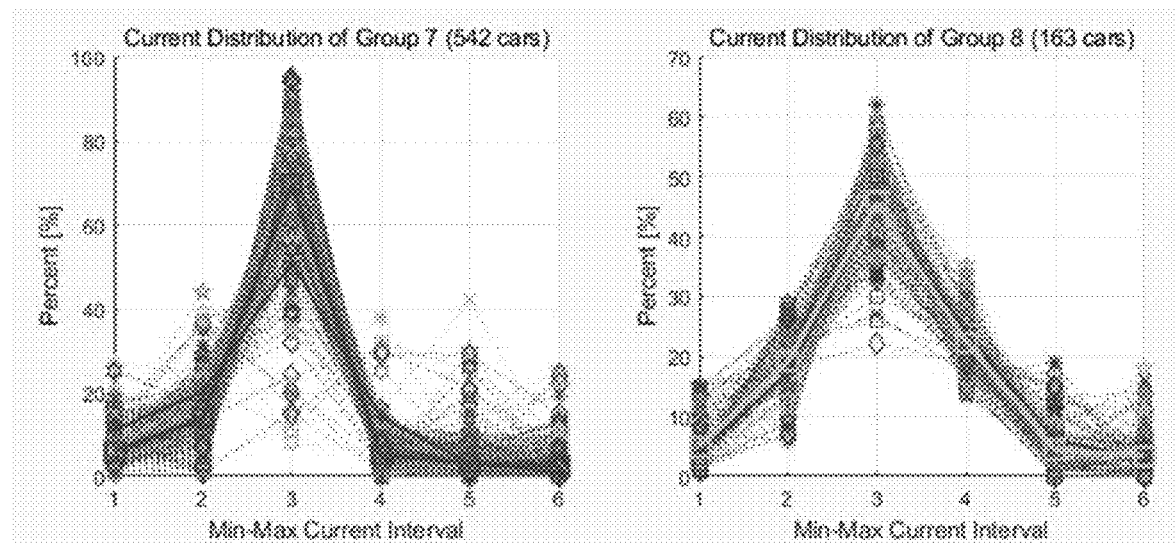
FIG. 5 illustrates another grouping process by traveling pattern.
Figure 6:
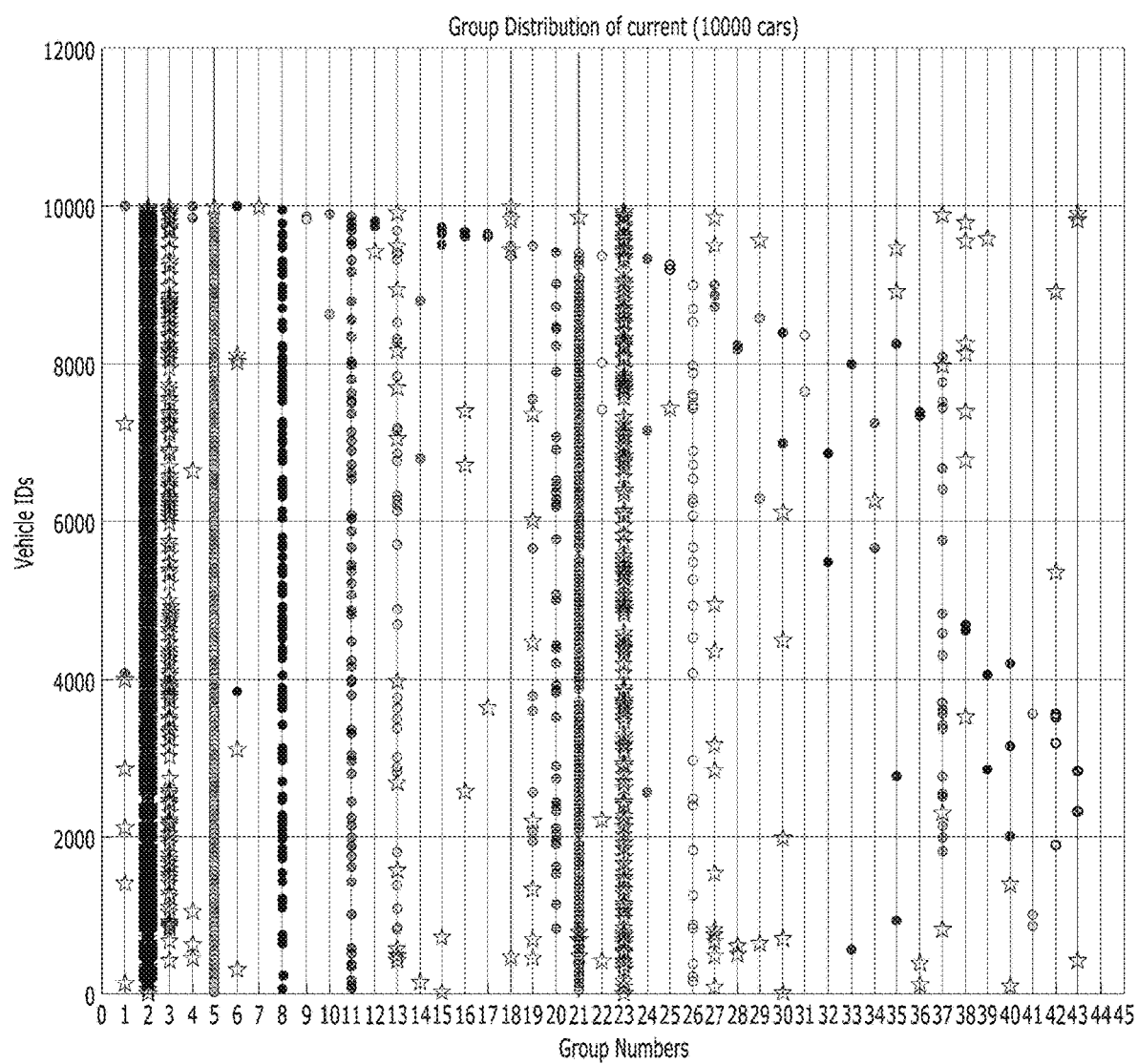
FIG. 6 illustrates another grouping process by traveling pattern.

FIGS. 4 to 6 are views illustrating a grouping process by traveling pattern.

As shown in FIGS. 4 to 6, the present invention may group collected information by traveling pattern to classify a plurality of groups by traveling pattern.

First, as shown in FIG. 4, the present invention may set current sections (for example, 6 sections) in order to analyze a charging and discharging pattern per vehicle, and may store a profile by battery charge and discharge current section.

In addition, as shown in FIG. 5, the present invention may calculate a current occupation rate by battery charge and discharge current section.

FIG. 5 shows the distribution of a current occupation rate of current sections by vehicle of only two groups.

Subsequently, as shown in FIG. 6, the present invention may calculate a correlation coefficient by vehicle based on the current occupation rate, may classify vehicles as the same group in the case in which the correlation coefficient is greater than a predetermined rate, may classify vehicles as an unassigned group in the case in which the correlation coefficient is equal to or less than the predetermined rate, may calculate an average current occupation rate by group, may calculate a correlation coefficient between the vehicles classified as the unassigned group and the average current occupation rate by group, may reclassify the vehicles classified as the unassigned group in the case in which the correlation coefficient is greater than a predetermined rate, and may maintain the vehicles classified as the unassigned group in the case in which the correlation coefficient is equal to or less than the predetermined rate.

As an example, the data grouping unit 220 may classify vehicles as the same group in the case in which the correlation coefficient is greater than about 70%, may classify vehicles as an unassigned group in the case in which the correlation coefficient is equal to or less than about 70%, may reclassify the vehicles classified as the unassigned group in the case in which the correlation coefficient is greater than about 70%, and may maintain the vehicles classified as the unassigned group in the case in which the correlation coefficient is equal to or less than about 70%.

FIG. 6 shows grouping based on correlation among total vehicles, for example, based on correlation among about 10000 vehicles belonging to a total of 44 groups.

Figure 7:
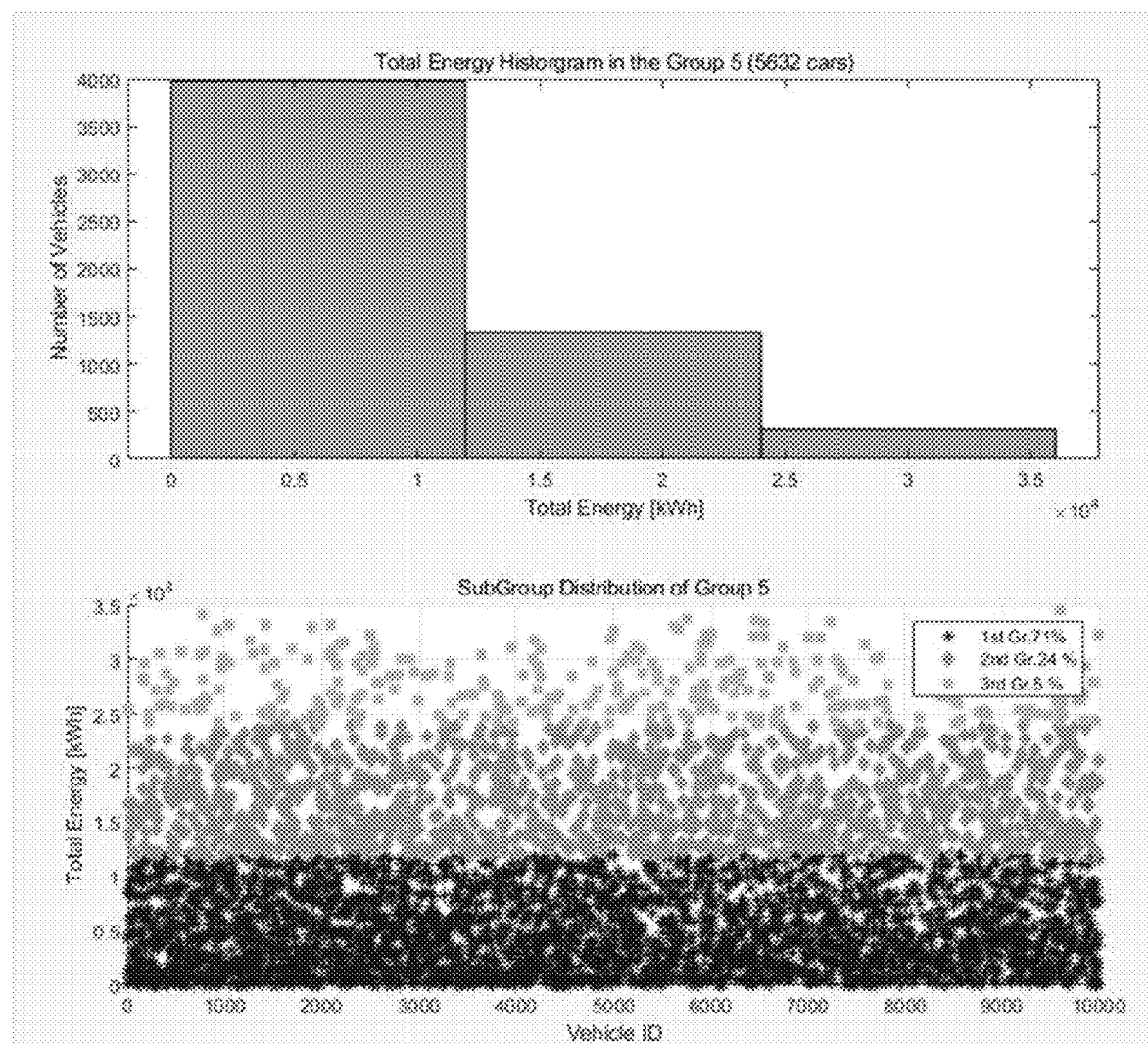
FIG. 7 is a view illustrating a grouping process by total amount of energy that is used.

FIG. 7 is a view illustrating a grouping process by total amount of energy that is used.

As shown in FIG. 7, the present invention may regroup information in the groups by traveling pattern by amount of energy that is used to classify a plurality of subgroups by use of energy.

Here, when classifying the subgroups by use of energy, the present invention may calculate vehicles in the groups by traveling pattern using a plurality of histogram sections depending on the total amount of energy that is used, and may perform subgrouping by histogram section to classify subgroups by use of energy.

Figure 8:
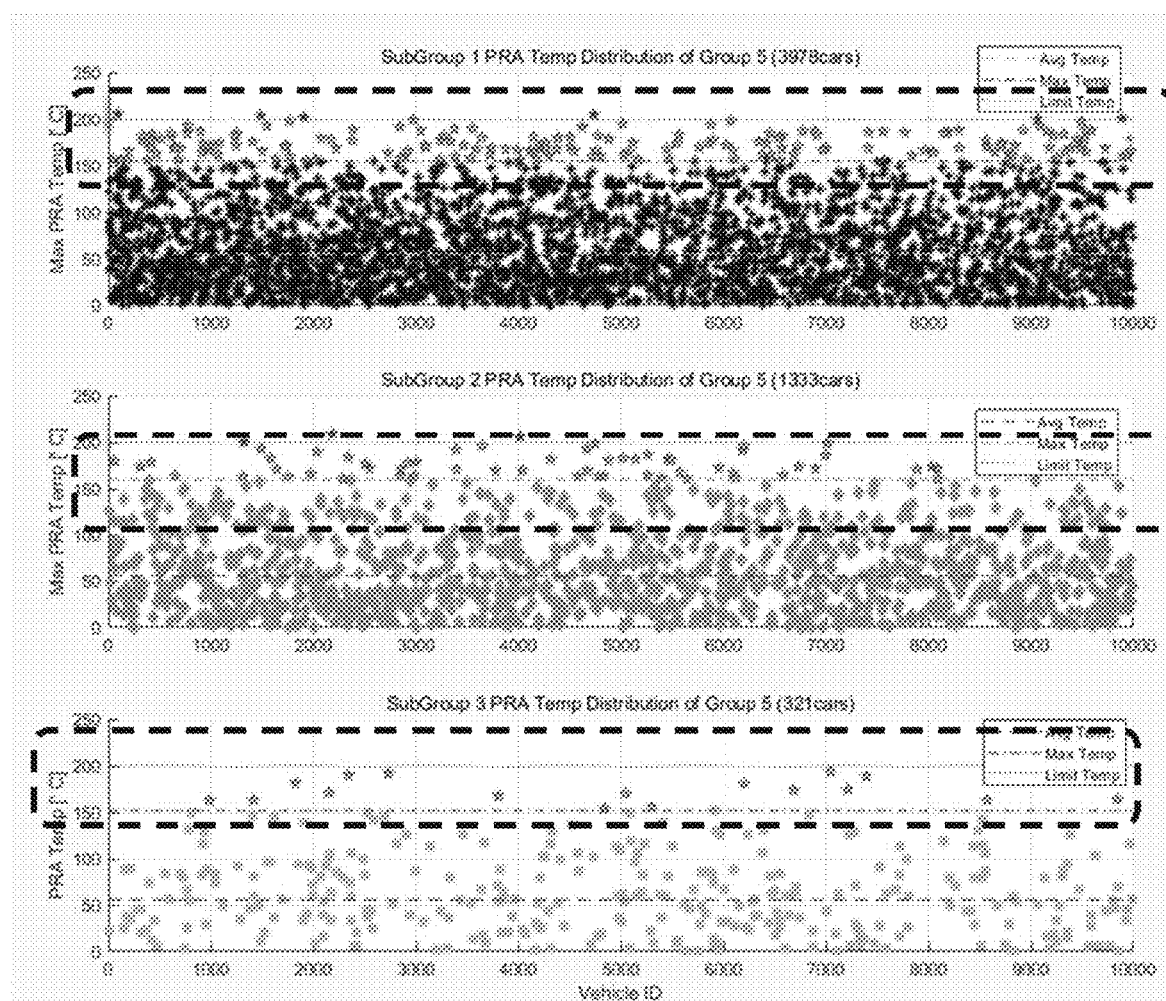
FIG. 8 is a view illustrating a PRA temperature monitoring process by vehicle.

FIG. 8 is a view illustrating a PRA temperature monitoring process by vehicle.

As shown in FIG. 8, the present invention may monitor the PRA temperature and the actual output of battery by vehicle of each subgroup, and may set the monitoring step by vehicle based on the result of monitoring.

The present invention may monitor the vehicle in the caution step of the monitoring step in the case in which the maximum PRA temperature and the PRA temperature increase rate per output are within a predetermined upper rate in the grouped information and occur successively for several cycles, and may monitor the vehicle in the normal step of the monitoring step in the case in which the maximum PRA temperature and the PRA temperature increase rate per output are not within the predetermined upper rate in the grouped information.

As an example, as shown in FIG. 8, in the case in which the maximum PRA temperature and the PRA temperature increase rate per output are within upper 5% in the grouped information and occur successively for two cycles, the present invention may monitor the vehicle in the caution step of the monitoring step.

In addition, the present invention may monitor the vehicle in the warning step of the monitoring step in the case in which the PRA temperature of the vehicle reaches the predetermined percentage of the critical temperature.

As an example, the predetermined percentage of the critical temperature may be about 70% of the critical temperature.

Here, the critical temperature may be about 200° C.; however, the present invention is not limited thereto.

In the case in which the PRA temperature of the vehicle does not reach the predetermined percentage of the critical temperature, the present invention may monitor the vehicle in the normal step of the monitoring step.

Figure 9:
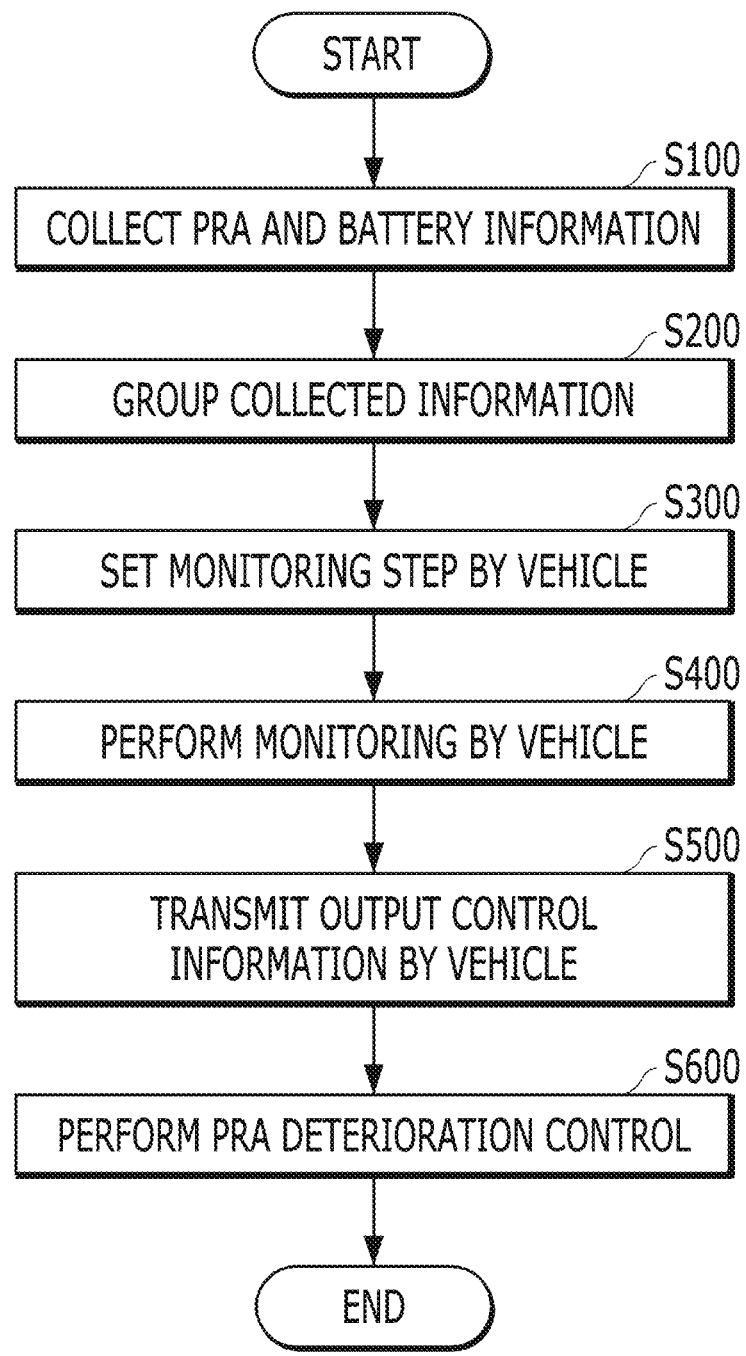
FIG. 9 is a flowchart illustrating a PRA deterioration control method of a PRA deterioration control system for vehicles according to an embodiment of the present invention.

FIG. 9 is a flowchart illustrating a PRA deterioration control method of a PRA deterioration control system for vehicles according to an embodiment of the present invention.

As shown in FIG. 9, the server according to the present invention may collect PRA and battery information from a vehicle (S100).

Here, the server may collect information including vehicle identification (ID), the accumulated amount of charge and discharge energy of the battery, a rate by section of each current that is used, an actual output of battery, and a PRA temperature from the vehicle.

The server may group the collected information (S200).

Here, the server may group the collected information by traveling pattern to classify a plurality of groups by traveling pattern, and may regroup information in the groups by traveling pattern by amount of energy that is used to classify a plurality of subgroups by use of energy.

As an example, when classifying the groups by traveling pattern, the server may store a profile by battery charge and discharge current section, may calculate a current occupation rate by battery charge and discharge current section, may calculate a correlation coefficient by vehicle based on the current occupation rate, may classify vehicles as the same group in the case in which the correlation coefficient is greater than a predetermined rate, may classify vehicles as an unassigned group in the case in which the correlation coefficient is equal to or less than the predetermined rate, may calculate an average current occupation rate by group, may calculate a correlation coefficient between the vehicles classified as the unassigned group and the average current occupation rate by group, may reclassify the vehicles classified as the unassigned group in the case in which the correlation coefficient is greater than a predetermined rate, and may maintain the vehicles classified as the unassigned group in the case in which the correlation coefficient is equal to or less than the predetermined rate.

In addition, when classifying the subgroups by use of energy, the server may calculate vehicles in the groups by traveling pattern using a plurality of histogram sections depending on the total amount of energy that is used, and may perform subgrouping by histogram section to classify subgroups by use of energy.

Subsequently, the server may set a monitoring step by vehicle based on the grouped information (S300).

Here, the server may monitor the PRA temperature and the actual output of battery by vehicle of each subgroup, and may set the monitoring step by vehicle based on the result of monitoring.

Next, the server may perform monitoring by vehicle in response to the set monitoring step by vehicle (S400).

Here, the server may monitor the vehicle in a caution step of the monitoring step in the case in which the maximum PRA temperature and a PRA temperature increase rate per output are within a predetermined upper rate in the grouped information and occur successively for several cycles, and may monitor the vehicle in a normal step of the monitoring step in the case in which the maximum PRA temperature and the PRA temperature increase rate per output are not within the predetermined upper rate in the grouped information.

In addition, the server may monitor the vehicle in a warning step of the monitoring step in the case in which the PRA temperature of the vehicle reaches a predetermined percentage of a critical temperature.

The server may transmit output control information by vehicle corresponding to the result of monitoring to the vehicle (S500).

Here, the server may transmit output control information including vehicle identification (ID), monitoring step information by vehicle, and an active output limit value of the battery to the vehicle in the case in which the monitoring step is a warning step.

Subsequently, the vehicle may perform PRA deterioration control based on the output control information (S600).

Here, the vehicle may primarily limit the battery output in the case in which the PRA temperature reaches the predetermined percentage of the critical temperature, may secondarily limit the battery output in the case in which the PRA temperature continuously increases for a predetermined time, and may turn off the main relay of the PRA in the case in which the PRA temperature exceeds the critical temperature.

In the present invention, as described above, it is possible to collect the PRA and battery information of the vehicle, to group the collected information, to set the monitoring step by vehicle based on the grouped information, and to periodically monitor the deteriorated state of the PRA based on the monitoring step by vehicle, whereby it is possible to predict deterioration of the PRA and to actively control deterioration of the PRA.

Also, in the present invention, it is possible to construct logic only by changing software without additional hardware.

Also, in the present invention, it is possible to determine the extent of deterioration or breakdown of the PRA through comparison in PRA temperature between vehicles.

Also, in the present invention, it is possible to preemptively limit power, whereby it is possible to prevent acceleration of generation of heat in the battery or deterioration of the PRA.

Meanwhile, data items transmitted and received between the server and the vehicle according to the present invention are as shown in Table 1 below.

TABLE 1

| Data items | Transmission from vehicle to server | Transmission from server to vehicle | Remarks |
| --- | --- | --- | --- |
| Vehicle identification (ID) | ○ | ○ | For tracking vehicle having abnormal behavior |
| Accumulated amount of charge and discharge energy of battery | ○ | | Calculation of PRA deterioration average of group |
| Rate by section of each current used | ○ | | For calculating charge and discharge current pattern |
| Active output limit value of battery | | ○ | Output by vehicle when entering warning step |
| Monitoring step information by vehicle | | ○ | Classification into normal, caution, and warning steps |
| Actual output of battery | ○ | | Calculation of PRA temperature increase rate per output |
| PRA temperature | ○ | | |

Figure 10:
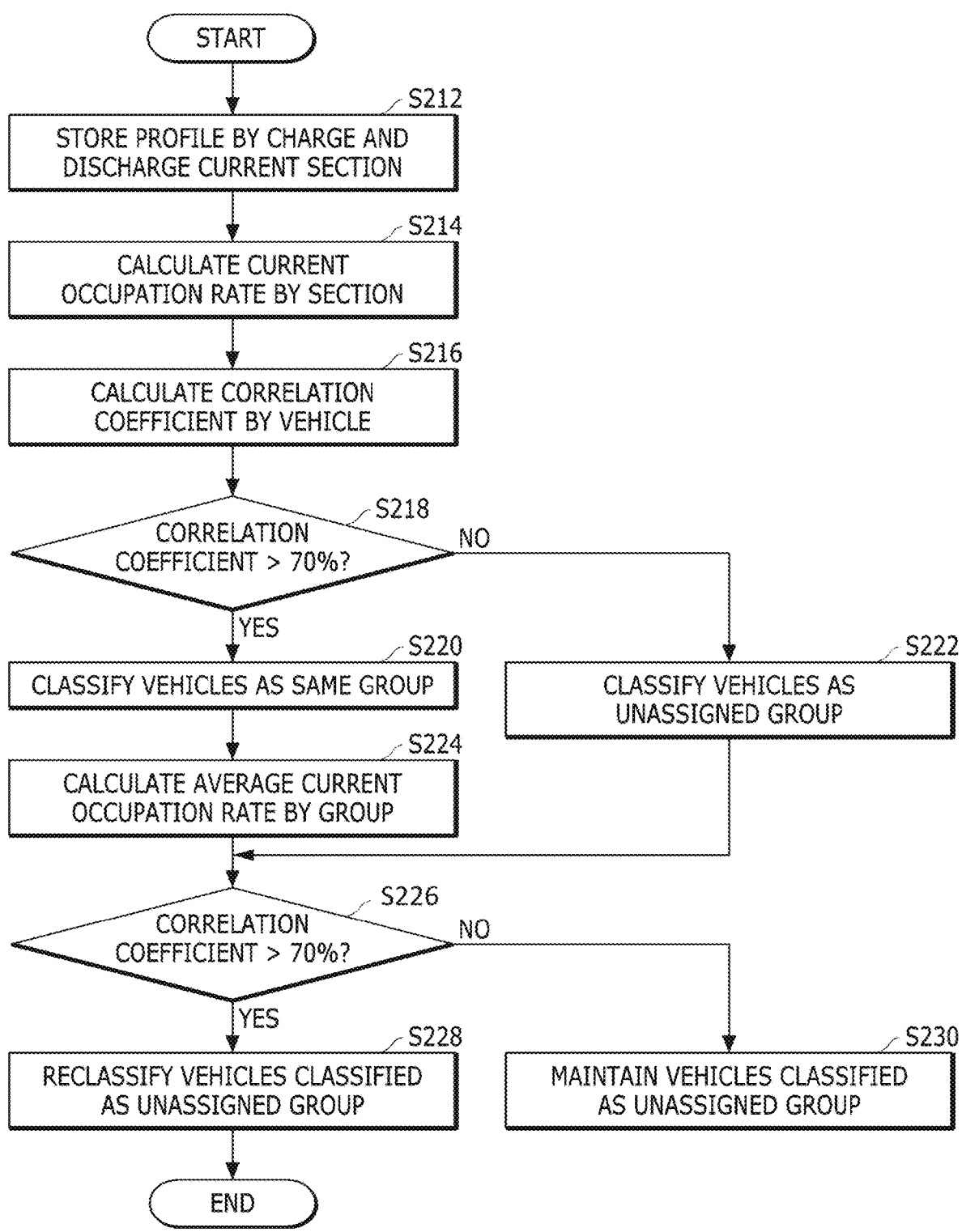
FIG. 10 is a flowchart illustrating a grouping process by traveling pattern.
Figure 11:
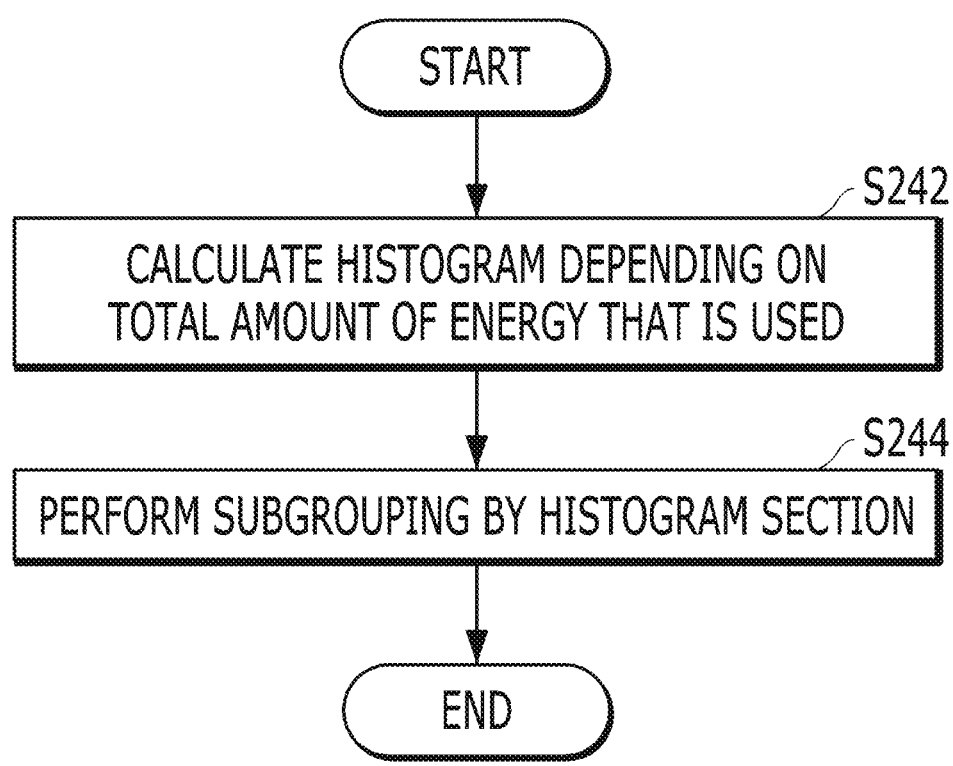
FIG. 11 is a flowchart illustrating a grouping process by user of total energy.

FIGS. 10 and 11 are flowcharts illustrating a collected information grouping process according to the present invention.

As shown in FIGS. 10 and 11, the server may group collected information by traveling pattern to classify a plurality of groups by traveling pattern, and may regroup information in the groups by traveling pattern by amount of energy that is used to classify a plurality of subgroups by use of energy.

As described above, the present invention may perform data grouping based on the collected information.

The reason for this is that it is necessary to determine the PRA severity degree in similar groups through grouping according to the total amount of energy that is used based on the battery charge and discharge current pattern by vehicle.

FIG. 10 is a flowchart illustrating a grouping process by traveling pattern.

As shown in FIG. 10, first, the present invention may store a profile by battery charge and discharge current section (S212).

Next, the present invention may calculate a current occupation rate by battery charge and discharge current section (S214).

Subsequently, the present invention may calculate a correlation coefficient by vehicle based on the current occupation rate (S216).

Next, the present invention may determine whether the correlation coefficient is greater than a predetermined rate (S218).

As an example, the predetermined rate may be about 70%; however, the present invention is not limited thereto.

The present invention may classify vehicles as the same group in the case in which the correlation coefficient is greater than the predetermined rate (S220), and may classify vehicles as an unassigned group in the case in which the correlation coefficient is equal to or less than the predetermined rate (S222).

Subsequently, the present invention may calculate an average current occupation rate by group (S224).

Next, the present invention may calculate a correlation coefficient between the vehicles classified as the unassigned group and the average current occupation rate by group, and may determine whether the correlation coefficient is greater than a predetermined rate (S226).

As an example, the predetermined rate may be about 70%; however, the present invention is not limited thereto.

The present invention may reclassify the vehicles classified as the unassigned group in the case in which the correlation coefficient is greater than the predetermined rate (S228), and may maintain the vehicles classified as the unassigned group in the case in which the correlation coefficient is equal to or less than the predetermined rate (S230).

FIG. 11 is a flowchart illustrating a grouping process by user of total energy.

As shown in FIG. 11, the present invention may calculate vehicles in the groups by traveling pattern using a plurality of histogram sections depending on the total amount of energy that is used (S242).

Subsequently, the present invention may perform subgrouping by histogram section to classify subgroups by use of energy (S244).

Figure 12:
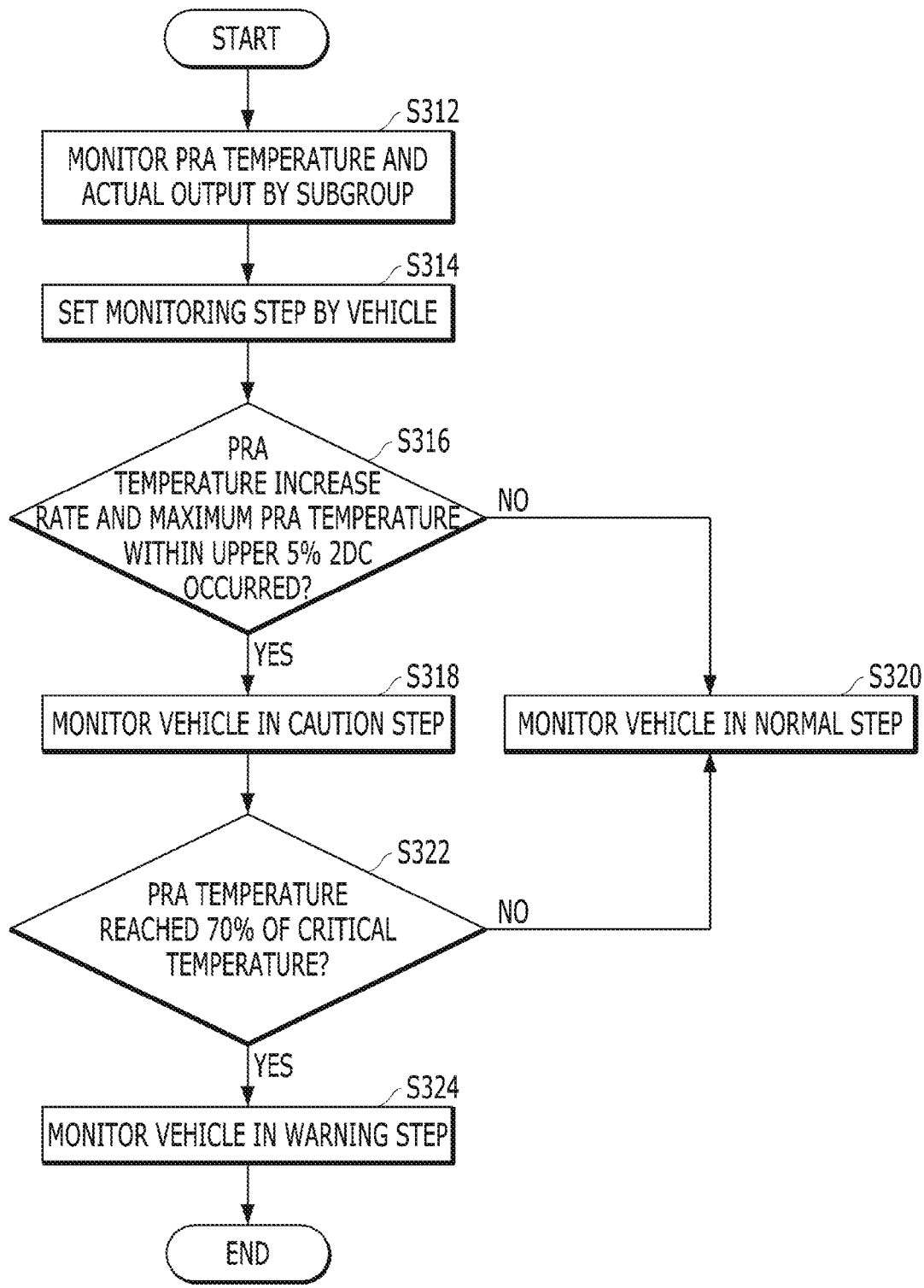
FIG. 12 is a flowchart illustrating a PRA temperature monitoring step setting process by vehicle.

FIG. 12 is a flowchart illustrating a PRA temperature monitoring step setting process by vehicle according to the present invention.

As shown in FIG. 12, the present invention may monitor a PRA temperature and an actual output of battery by vehicle of each subgroup (S312).

In addition, the present invention may set a monitoring step by vehicle based on the result of monitoring (S314).

Subsequently, the present invention may determine whether the maximum PRA temperature and a PRA temperature increase rate per output are within a predetermined upper rate in the grouped information and occur successively for several cycles (S316).

Next, the present invention may monitor the vehicle in the caution step of the monitoring step in the case in which the maximum PRA temperature and the PRA temperature increase rate per output are within the predetermined upper rate in the grouped information and occur successively for several cycles (S318), and may monitor the vehicle in the normal step of the monitoring step in the case in which the maximum PRA temperature and the PRA temperature increase rate per output are not within the predetermined upper rate in the grouped information (S320).

As an example, in the case in which the maximum PRA temperature and the PRA temperature increase rate per output are within upper 5% in the grouped information and occur successively for two cycles, the present invention may monitor the vehicle in the caution step of the monitoring step.

Next, the present invention may determine whether the PRA temperature of the vehicle reaches a predetermined percentage of a critical temperature (S322).

Subsequently, the present invention may monitor the vehicle in the warning step of the monitoring step in the case in which the PRA temperature of the vehicle reaches the predetermined percentage of the critical temperature (S324).

As an example, the predetermined percentage of the critical temperature may be about 70% of the critical temperature.

In the case in which the PRA temperature of the vehicle does not reach the predetermined percentage of the critical temperature, the present invention may monitor the vehicle in the normal step of the monitoring step (S320).

Meanwhile, in the present invention, monitoring steps for active output control may be set by vehicle, as shown in Table 2 below.

TABLE 2

| Monitoring step | Determination period | Entry condition | Output control |
|---|---|---|---|
| Normal | Once (when finished) | (1) Maximum PRA temperature is within lower 95%, and (2) PRA temperature increase rate per output is within lower 95%. | X |
| Caution | Once (when finished) | (1) Maximum PRA temperature is within upper 5%, (2) PRA temperature increase rate per output is within upper 5%, and (3) Conditions (1) and (2) occur successively for 2 cycles or PRA temperature reaches critical temperature. | X |
| Warning | Real time (1 second) | (1) PRA temperature increases continuously after reaching 70% of critical temperature, or (2) PRA temperature exceeds critical temperature. | ○ |

That is, the present invention may set the monitoring determination period to one time at the point in time when collection of the PRA information is finished during traveling and charging in the case in which the monitoring step is a normal step or a caution step, and may set the monitoring determination period to 1 second during traveling and charging in the case in which the monitoring step is a warning step.

Figure 13:
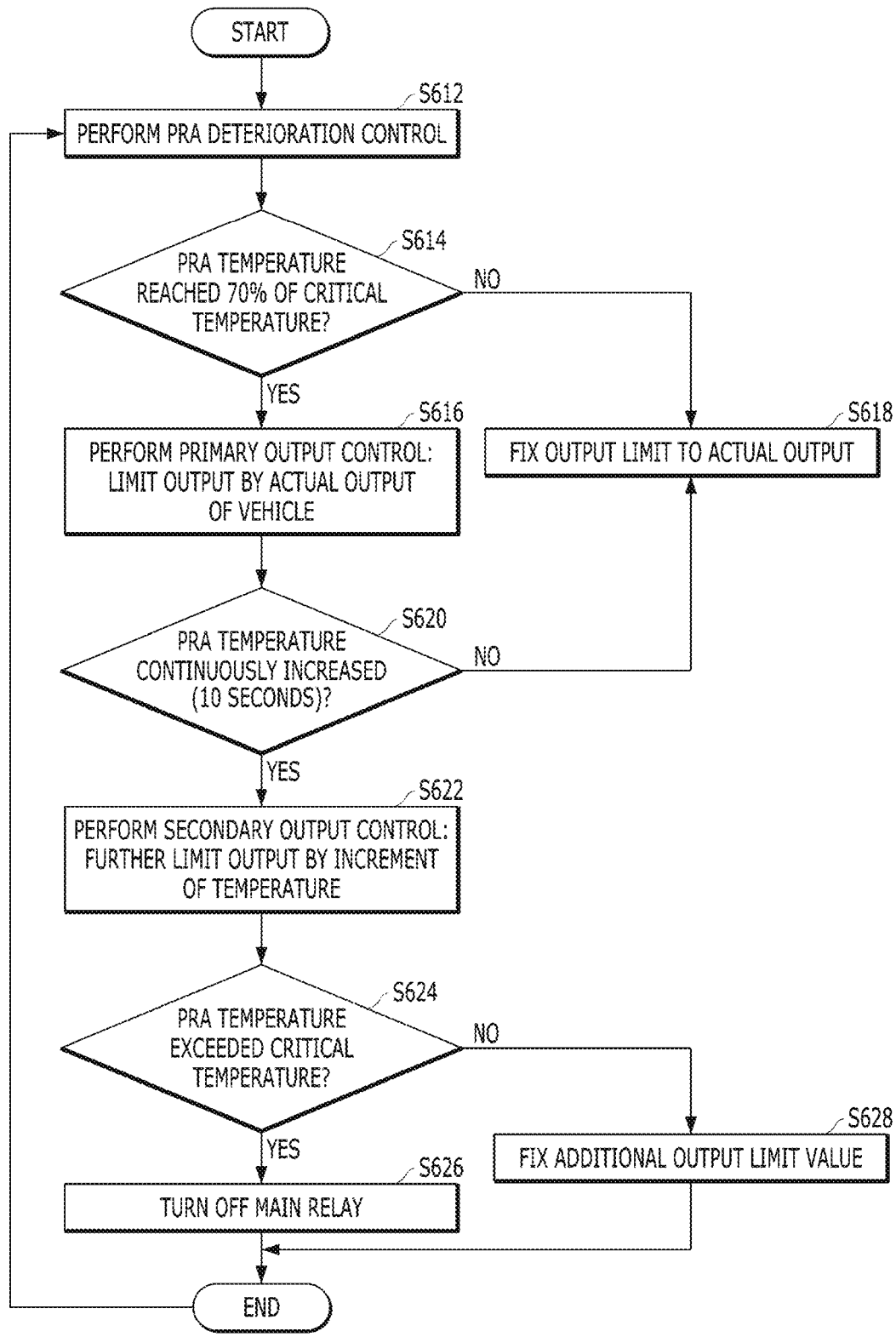
FIG. 13 is a flowchart illustrating an active PRA output control process.

FIG. 13 is a flowchart illustrating an active PRA output control process according to the present invention.

As shown in FIG. 13, the present invention may perform PRA deterioration control of the vehicle in the case in which the monitoring step is a warning step (S612).

Next, the present invention may determine whether the PRA temperature reaches a predetermined percentage of a critical temperature (S614).

As an example, the predetermined percentage of the critical temperature may be about 70% of the critical temperature; however, the present invention is not limited thereto.

Subsequently, the present invention may primarily limit the battery output in the case in which the PRA temperature reaches the predetermined percentage of the critical temperature (S616), and may limit the battery output by the actual output of battery in the case in which the PRA temperature does not reach the predetermined percentage of the critical temperature (S618).

Here, when primarily limiting the battery output, the present invention may limit the battery output by the actual output of battery.

In addition, the present invention may determine whether the PRA temperature continuously increases for a predetermined time (S620).

Here, the predetermined time may be about 10 seconds; however, the present invention is not limited thereto.

Next, the present invention may secondarily limit the battery output in the case in which the PRA temperature continuously increases for the predetermined time (S622), and may limit the battery output by the actual output of battery in the case in which the PRA temperature does not continuously increase for the predetermined time (S618).

Here, when secondarily limiting the battery output, the present invention may further limit the battery output by an increment of the PRA temperature.

Subsequently, the present invention may determine whether the PRA temperature exceeds the critical temperature (S624).

Next, the present invention may turn off the main relay of the PRA in the case in which the PRA temperature exceeds the critical temperature (S626), and may further limit the battery output by an increment of the PRA temperature in the case in which the PRA temperature does not exceed the critical temperature (S628).

In addition, when primarily or secondarily limiting the battery output, the present invention may transmit a preventive maintenance guidance flag to the cluster.

In the case in which the critical temperature is about 200° C., the present invention may perform output control in the warning step when the PRA temperature reaches about 70% of the critical temperature (about 140° C.) or when the PRA temperature exceeds the critical temperature.

In addition, the present invention may limit the battery output by the actual output of battery when the PRA temperature reaches about 70% of the critical temperature (about 140° C.), and may limit the battery output by a target value corresponding to 70% of the critical temperature (about 140° C.) at a temperature increasing at the maximum PRA temperature change rate ($\Delta P_{BAT}/\Delta T_{PRA}$) per output calculated by vehicle when the PRA temperature continuously increases for about 10 seconds.

As an example, for a vehicle in which the PRA temperature change rate ($\Delta P_{BAT}/\Delta T_{PRA}$) is measured to be 2 kW/1° C., the PRA temperature change rate ($\Delta P_{BAT}/\Delta T_{PRA}$) is about 20° C. (160° C.−140° C.) when the PRA temperature of the vehicle continuously increases to about 160° C., and therefore, it is possible to limit the battery output by 40 kW (2 kW*20).

As described above, the present invention may perform the active PRA output control, as shown in Table 3 below.

TABLE 3

| Monitoring step | Control period | Entry | Reaction |
|---|---|---|---|
| Warning | Real time (1 second) | When reaching 70% of critical temperature | 1. Limiting output by actual output 2. Further limiting output by increment of |

TABLE 3-continued

| Monitoring step | Control period | Entry | Reaction |
|---|---|---|---|
| | | | temperature 3. Transmitting preventive maintenance guidance flag to cluster |
| | | When exceeding critical temperature | Turning off main relay |

In addition, a computer-readable recording medium containing a program for performing the PRA deterioration control method of the PRA deterioration control system for vehicles according to an embodiment of the present invention may execute the processes included in the PRA deterioration control method of the PRA deterioration control system for vehicles.

In the PRA deterioration control system for vehicles and the PRA deterioration control method thereof according to at least one embodiment of the present invention, constructed as described above, it is possible to collect the PRA and battery information of the vehicle, to group the collected information, to set the monitoring step by vehicle based on the grouped information, and to periodically monitor the deteriorated state of the PRA based on the monitoring step by vehicle, whereby it is possible to predict deterioration of the PRA and to actively control deterioration of the PRA.

Also, in the present invention, it is possible to construct logic only by changing software without additional hardware.

Also, in the present invention, it is possible to determine the extent of deterioration or breakdown of the PRA through comparison in PRA temperature between vehicles.

Also, in the present invention, it is possible to preemptively limit power, whereby it is possible to prevent acceleration of generation of heat in the battery or deterioration of the PRA.

It will be appreciated by those skilled in the art that the effects achievable through the present invention are not limited to those that have been particularly described hereinabove and that other effects of the present invention will be more clearly understood from the above detailed description.

The PRA deterioration control method according to the present invention described above may be implemented as a computer-readable program stored in a computer-readable recording medium. The computer-readable medium may be any type of recording device in which data is stored in a computer-readable manner. The computer-readable medium may include, for example, a hard disk drive (HDD), a solid-state disk (SSD), a silicon disk drive (SDD), a read-only memory (ROM), a random access memory (RAM), a compact disc read-only memory (CD-ROM), a magnetic tape, a floppy disk, and an optical data storage device.

The above detailed description is not to be construed as limiting the present invention in any aspect, but is to be considered by way of example. The scope of the present invention should be determined by reasonable interpretation of the accompanying claims, and all equivalent modifications made without departing from the scope of the present invention should be understood as being included in the following claims.

What is claimed is:

1. A power relay assembly (PRA) deterioration control system for vehicles, the PRA deterioration control system comprising:
a plurality of vehicles configured to transmit PRA and battery information; and
a server configured to collect the PRA and battery information of the plurality of vehicles and to transmit output control information for PRA deterioration control to the plurality of vehicles, wherein
upon collecting the PRA and battery information of the plurality of vehicles, the server groups the collected PRA and battery information, sets a monitoring step by vehicle based on the grouped information, performs monitoring by vehicle in response to the set monitoring step by vehicle, and transmits output control information by vehicle corresponding to a result of monitoring to the plurality of vehicles such that each vehicle performs PRA deterioration control.

2. The PRA deterioration control system according to claim 1, wherein, when performing the PRA deterioration control, the each vehicle primarily limits a battery output in a case in which a PRA temperature reaches a predetermined percentage of a critical temperature, secondarily limits the battery output in a case in which the PRA temperature continuously increases for a predetermined time, and turns off a main relay of the PRA in a case in which the PRA temperature exceeds the critical temperature.

3. The PRA deterioration control system according to claim 1, wherein the server collects information comprising at least one of vehicle identification (ID), an accumulated amount of charge and discharge energy of the battery, a rate by section of each current that is used, an actual output of battery, or a PRA temperature from the plurality of vehicles.

4. The PRA deterioration control system according to claim 1, wherein, when grouping the collected information, the server groups the collected PRA and battery information by traveling pattern to classify a plurality of groups by traveling pattern, and regroups information in the groups by traveling pattern by amount of energy that is used to classify a plurality of subgroups by use of energy.

5. The PRA deterioration control system according to claim 4, wherein, when classifying the groups by traveling pattern, the server stores a profile by battery charge and discharge current section, calculates a current occupation rate by battery charge and discharge current section, calculates a correlation coefficient by vehicle based on the current occupation rate, classifies vehicles as a same group in a case in which the correlation coefficient is greater than a predetermined rate, classifies vehicles as an unassigned group in a case in which the correlation coefficient is equal to or less than the predetermined rate, calculates an average current occupation rate by group, calculates a correlation coefficient between the vehicles classified as the unassigned group and the average current occupation rate by group, reclassifies the vehicles classified as the unassigned group in a case in which the correlation coefficient is greater than a predetermined rate, and maintains the vehicles classified as the unassigned group in a case in which the correlation coefficient is equal to or less than the predetermined rate.

6. The PRA deterioration control system according to claim 4, wherein, when classifying the subgroups by use of energy, the server calculates vehicles in the groups by traveling pattern using a plurality of histogram sections depending on a total amount of energy that is used, and performs subgrouping by histogram section to classify the subgroups by use of energy.

7. The PRA deterioration control system according to claim 4, wherein, when setting the monitoring step by vehicle, the server monitors a PRA temperature and an actual output of battery by vehicle of each subgroup, and sets the monitoring step by vehicle based on a result of monitoring.

8. The PRA deterioration control system according to claim 1, wherein, when performing the monitoring by vehicle, the server monitors the each vehicle in a caution step of the monitoring step when a maximum PRA temperature and a PRA temperature increase rate per output are within a predetermined upper rate in the grouped information and occur successively for several cycles, and monitors the each vehicle in a normal step of the monitoring step when the maximum PRA temperature and the PRA temperature increase rate per output are not within the predetermined upper rate in the grouped information.

9. The PRA deterioration control system according to claim 1, wherein, when performing the monitoring by vehicle, the server monitors the each vehicle in a warning step of the monitoring step in a case in which a PRA temperature of the each vehicle reaches a predetermined percentage of a critical temperature.

10. The PRA deterioration control system according to claim 1, wherein, when transmitting the output control information by vehicle, the server transmits the output control information comprising at least one of vehicle identification (ID), monitoring step information by vehicle, or an active output limit value of the battery to the each vehicle in a case in which the monitoring step is a warning step.

11. A PRA deterioration control method of a PRA deterioration control system for vehicles comprising a server, the PRA deterioration control method comprising:
the server collecting PRA and battery information from a plurality of vehicles;
the server grouping the collected information;
the server setting a monitoring step by vehicle based on the grouped information;
the server performing monitoring by vehicle in response to the set monitoring step by vehicle;
the server transmitting output control information by vehicle corresponding to a result of monitoring to the plurality of vehicles; and
the plurality of vehicles performing PRA deterioration control based on the output control information.

12. The PRA deterioration control method according to claim 11, wherein grouping the collected information comprises grouping the collected information by traveling pattern to classify a plurality of groups by traveling pattern and regrouping information in the groups by traveling pattern by amount of energy that is used to classify a plurality of subgroups by use of energy.

13. The PRA deterioration control method according to claim 12, wherein classifying a plurality of groups by traveling pattern comprises storing a profile by battery charge and discharge current section, calculating a current occupation rate by battery charge and discharge current section, calculating a correlation coefficient by vehicle based on the current occupation rate, classifying vehicles as a same group in a case in which the correlation coefficient is greater than a predetermined rate, classifying vehicles as an unassigned group in a case in which the correlation coefficient is equal to or less than the predetermined rate, calculating an average current occupation rate by group, calculating a correlation coefficient between the vehicles classified as the unassigned group and the average current occupation rate by group, reclassifying the vehicles classified as the unassigned group in a case in which the correlation coefficient is greater than a predetermined rate, and maintaining the vehicles classified as the unassigned group in a case in which the correlation coefficient is equal to or less than the predetermined rate.

14. The PRA deterioration control method according to claim 12, wherein classifying a plurality of subgroups by use of energy comprises calculating vehicles in the groups by traveling pattern using a plurality of histogram sections depending on a total amount of energy that is used and performing subgrouping by histogram section to classify the subgroups by use of energy.

15. The PRA deterioration control method according to claim 11, wherein the performing monitoring by vehicle comprises:
monitoring the each vehicle in a caution step of the monitoring step when a maximum PRA temperature and a PRA temperature increase rate per output are within a predetermined upper rate in the grouped information and occur successively for several cycles; and
monitoring the each vehicle in a normal step of the monitoring step when the maximum PRA temperature and the PRA temperature increase rate per output are not within the predetermined upper rate in the grouped information.

16. The PRA deterioration control method according to claim 11, wherein the performing monitoring by vehicle comprises monitoring the each vehicle in a warning step of the monitoring step in a case in which a PRA temperature of the each vehicle reaches a predetermined percentage of a critical temperature.

17. The PRA deterioration control method according to claim 11, wherein the performing PRA deterioration control comprises primarily limiting a battery output in a case in which a PRA temperature reaches a predetermined percentage of a critical temperature, secondarily limiting the battery output in a case in which the PRA temperature continuously increases for a predetermined time, and turning off a main relay of the PRA in a case in which the PRA temperature exceeds the critical temperature.

18. A computer-readable recording medium containing a program for performing the method according to claim 11.

19. A server of a PRA deterioration control system for vehicles, the server comprising:
a communication unit communicatively connected to a plurality of vehicles;
a data grouping unit configured to collect PRA and battery information of the vehicle and to group the collected information; and
an active output controller configured to set a monitoring step by vehicle based on the grouped information, to perform monitoring by vehicle in response to the set monitoring step by vehicle, and to transmit output control information by vehicle corresponding to a result of monitoring to the plurality of vehicles.

* * * * *